United States Patent
Kikuchi (10) Patent No.: US 9,659,756 B2
(45) Date of Patent: May 23, 2017

(54) PLASMA ETCHING APPARATUS AND PLASMA CLEANING METHOD

(71) Applicant: TOKYO ELECTRON LIMITED, Tokyo (JP)

(72) Inventor: Takamichi Kikuchi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 747 days.

(21) Appl. No.: 14/035,023

(22) Filed: Sep. 24, 2013

(65) Prior Publication Data
US 2014/0020709 A1    Jan. 23, 2014

Related U.S. Application Data

(62) Division of application No. 12/630,155, filed on Dec. 3, 2009, now abandoned.

(30) Foreign Application Priority Data

Dec. 9, 2008    (JP) .................................. 2008-313100

(51) Int. Cl.
*H01J 37/32*    (2006.01)
*H01L 21/02*    (2006.01)
*H01L 21/683*    (2006.01)

(52) U.S. Cl.
CPC .. *H01J 37/32862* (2013.01); *H01J 37/32091* (2013.01); *H01J 37/32146* (2013.01);
(Continued)

(58) Field of Classification Search
CPC ........... H01J 37/32091; H01J 37/32146; H01J 37/32559; H01J 37/32862; H01J 2237/022
See application file for complete search history.

(56) References Cited

U.S. PATENT DOCUMENTS

| | | |
|---|---|---|
| 5,698,062 A | 12/1997 | Sakamoto et al. |
| 5,997,687 A | 12/1999 | Koshimizu |

(Continued)

FOREIGN PATENT DOCUMENTS

| | | |
|---|---|---|
| CN | 1694228 A | 11/2005 |
| CN | 1783430 A | 6/2006 |

(Continued)

OTHER PUBLICATIONS

Machine translation of JP2001-313284A; Kadoya et al. 2001.*

(Continued)

*Primary Examiner* — Michael Kornakov
*Assistant Examiner* — Natasha Campbell
(74) *Attorney, Agent, or Firm* — Rothwell, Figg, Ernst & Manbeck, P.C.

(57) ABSTRACT

A plasma etching apparatus includes an electrostatic chuck and an etching gas supply unit for supplying an etching gas to a processing space between a first and a second electrode to perform a dry etching process on the target object. The apparatus further includes a cleaning gas supply unit for supplying a cleaning gas to a processing space; a first high frequency power supply unit for supplying a first high frequency power to the first electrode; and a controller for controlling the first high frequency power supply unit such that a first period during which the first high frequency power has a first amplitude that generates the plasma and a second period during which the first high frequency power has a second amplitude that generates substantially no plasma are alternately repeated at a specific cycle when the plasma cleaning is performed in the processing chamber without the target object.

19 Claims, 5 Drawing Sheets

(52) U.S. Cl.
CPC ... *H01J 37/32559* (2013.01); *H01J 2237/022* (2013.01); *H01L 21/6831* (2013.01)

(56) References Cited

U.S. PATENT DOCUMENTS

| | | | |
|---|---|---|---|
| 6,009,828 | A | 1/2000 | Tomita et al. |
| 6,074,518 | A | 6/2000 | Imafuku et al. |
| 6,089,181 | A | 7/2000 | Suemasa et al. |
| 6,110,287 | A | 8/2000 | Arai et al. |
| 6,165,376 | A | 12/2000 | Miyake et al. |
| 6,214,162 | B1 | 4/2001 | Koshimizu |
| 6,372,654 | B1 | 4/2002 | Tokashiki |
| 6,433,297 | B1 | 8/2002 | Kojima et al. |
| 6,562,190 | B1 | 5/2003 | Kuthi et al. |
| 6,642,149 | B2 | 11/2003 | Suemasa et al. |
| 2001/0022293 | A1 | 9/2001 | Maeda et al. |
| 2003/0007308 | A1 | 1/2003 | Harada et al. |
| 2004/0195216 | A1 | 10/2004 | Strang |
| 2004/0221958 | A1 | 11/2004 | Loewenhardt et al. |
| 2004/0242021 | A1 | 12/2004 | Kraus et al. |
| 2004/0250954 | A1 | 12/2004 | Choe et al. |
| 2005/0103441 | A1 | 5/2005 | Honda et al. |
| 2005/0183822 | A1 | 8/2005 | Ono et al. |
| 2005/0241762 | A1 | 11/2005 | Paterson et al. |
| 2006/0118044 | A1 | 6/2006 | Himori et al. |
| 2006/0154472 | A1 | 7/2006 | Kikuchi et al. |
| 2006/0216944 | A1 | 9/2006 | Kraus et al. |
| 2007/0181146 | A1 | 8/2007 | Ichijo |
| 2007/0184562 | A1 | 8/2007 | Ono et al. |
| 2008/0014758 | A1 | 1/2008 | Chou et al. |
| 2008/0026488 | A1 | 1/2008 | Panda et al. |
| 2008/0106842 | A1 | 5/2008 | Ito et al. |
| 2008/0110859 | A1* | 5/2008 | Koshiishi ......... H01J 37/32027 216/67 |
| 2008/0230008 | A1 | 9/2008 | Paterson et al. |
| 2009/0183771 | A1* | 7/2009 | Sannomiya ............ C23C 16/24 136/258 |
| 2010/0140221 | A1 | 6/2010 | Kikuchi |

FOREIGN PATENT DOCUMENTS

| | | |
|---|---|---|
| JP | 64-73620 A | 3/1989 |
| JP | 2000-156370 A | 6/2000 |
| JP | 2000-260595 A | 9/2000 |
| JP | 2001-185542 A | 7/2001 |
| JP | 2001-210705 A | 8/2001 |
| JP | 2001-313284 A | 11/2001 |
| JP | 2003-197536 A | 7/2003 |
| JP | 2004-47653 A | 2/2004 |
| JP | 2006-86325 A | 3/2006 |
| JP | 2006-186323 A | 7/2006 |
| JP | 2007-67455 A | 3/2007 |
| JP | 2008-4814 A | 1/2008 |
| JP | 2008-21860 A | 1/2008 |
| JP | 2008-117982 A | 5/2008 |
| KR | 10-2003-0084546 A | 11/2003 |
| KR | 10-2006-0014424 A | 2/2006 |
| KR | 10-2006-0092790 A | 8/2006 |

OTHER PUBLICATIONS

Search Report issued Jul. 26, 2010, in European Patent Application No. 08162504.8-1226/2026374.
Office Action issued Jul. 30, 2010, in Korean Patent Application No. 10-2008-0079816.
Chinese Office Action issued Jan. 19, 2011, in Patent Application No. 200810135193.6 (with English-language translation).
Korean Office Action issued Aug. 5, 2011, in Patent Application No. 10-2008-0079816 (with English-language translation).
Office Action issued Aug. 23, 2011, in China Application No. 200810135193.6 (with English translation).

* cited by examiner

| | TEST EXAMPLE 1 | TEST EXAMPLE 2 | TEST EXAMPLE 3 |
|---|---|---|---|
| | NON-MODULATED (CW) | PULSE-MODULATED | PULSE-MODULATED |
| | HF POWER=70W<br>TRIMMING TIME=20s | MODULATION FREQUENCY = 10kHz<br>DUTY = 50%<br>HF POWER (ON PERIOD) =70W<br>TRIMMING TIME = 20s | MODULATION FREQUENCY = 100kHz<br>DUTY = 50%<br>HF POWER (ON PERIOD) =85W<br>TRIMMING TIME = 26s |
| CENTRAL PORTION | Trim ratio=1.12, 101.8nm | Trim ratio=1.4, 104.5nm | Trim ratio=1.24, 103.8nm |
| EDGE PORTION | Trim ratio=1.12, 106.4nm | Trim ratio=1.1, 109.1nm | Trim ratio=1.9, 109.6nm |

PLASMA ETCHING APPARATUS AND PLASMA CLEANING METHOD

CROSS-REFERENCE TO RELATED APPLICATIONS

The present application is a Divisional Application of and claims the benefit of priority from co-pending U.S. application Ser. No. 12/630,155, filed Dec. 3, 2009, and further based upon and claims the benefit of priority from the Japanese Patent Application No. 2008-313100, filed Dec. 9, 2008. The entire contents of foregoing applications are incorporated herein by reference.

FIELD OF THE INVENTION

The present invention relates to a capacitively coupled plasma etching apparatus for performing a dry etching process on a target object by using a plasma and a plasma cleaning method for cleaning the inside of a processing chamber the plasma etching apparatus.

BACKGROUND OF THE INVENTION

In the manufacturing process of a semiconductor device or a flat panel display (FPD), a plasma is widely used in a process such as etching, deposit, oxidation, sputtering or the like since it has a good reactivity with a processing gas in a relatively low temperature. In a single wafer plasma etching apparatus, a capacitively coupled type is mainly used to generate a plasma.

An upper and a lower electrode are arranged in parallel with each other in a vacuum processing chamber included in a capacitively coupled plasma etching apparatus. Then, a target substrate (e.g., a semiconductor wafer or a glass substrate) is mounted on the lower electrode and a high frequency voltage is applied between the upper and the lower electrode. Accordingly, an electric field is generated between the electrodes by the high frequency voltage to accelerate electrons and, thus, the impact ionization occurs between the accelerated electrons and a processing gas, thereby generating a plasma. Then, a surface of the substrate is subjected to a desired etching process by radicals and ions in the plasma.

Here, since the electrode to which the high frequency voltage is applied is connected to a high frequency power supply via a blocking capacitor included in a matching unit, the electrode serves as a cathode. In a cathode coupling type in which a high frequency voltage is applied to a lower electrode as a cathode on which a substrate is mounted, ions in a plasma are attracted to the substrate in a substantial vertical direction, thereby performing an anisotropic etching with the outstanding directivity (see, e.g., Japanese Patent Application Publication No. 2000-260595).

Recently, in order to individually optimize the density of plasma and the selectivity of anisotropic etching, there has widely been employed a lower side dual frequency application type in which a first high frequency voltage having a relatively high frequency (e.g., 27 MHz or more) adequate for plasma generation and a second high frequency voltage having a relatively low frequency (e.g., 13.56 MHz or less) adequate for ion attraction are overlappingly applied to a lower electrode on which a substrate is mounted (see, e.g., Japanese Patent Application Publication No. 2000-156370 and corresponding U.S. Pat. No. 6,642,149 B2).

Moreover, in the capacitively coupled plasma etching apparatus, it is required to control the temperature of a substrate to be uniform by suppressing the increase of the temperature of the substrate caused by the heat transferred from the plasma during the plasma etching. To that end, the substrate is indirectly cooled by supplying a coolant having an adjusted temperature from a chiller unit to a coolant path provided inside the lower electrode to be circulated and a heat transfer gas such as He gas to a backside of the substrate through the lower electrode.

According to such a cooling method, a substrate holding unit is required to fixedly hold the substrate on the lower electrode against the supplying pressure of the heat transfer gas and, thus, an electrostatic chuck is mainly used as the substrate holding unit (see, e.g., Japanese Patent Laid-open Publication No. 2001-210705).

Typically, the electrostatic chuck includes a dielectric layer having a DC electrode therein which is provided on an upper surface (mounting surface) of the lower electrode and a preset DC voltage is applied to the DC electrode to attract a substrate by a Coulomb force generated between the substrate and the dielectric layer. For the electrostatic chuck, the dielectric layer has recently been made of alumina ceramic ($Al_2O_3$) having high plasma resistance and high heat resistance.

Meanwhile, in the capacitively coupled plasma etching apparatus, some of gaseous reaction products or by-products produced during the plasma etching are attached to members inside the chamber, especially, an upper electrode, a focus ring, a sidewall of the chamber and the like, which face a plasma generation space or a processing space, to be solidified into deposits.

As such, if the deposits attached to the members in the chamber are detached therefrom by being, e.g., peeled off, particles are generated, thereby decreasing the yield of devices. Accordingly, a cleaning process is regularly performed to remove the deposits from the members in the chamber. Such kinds of cleaning processes are classified into two groups, i.e., a gas cleaning performed by a thermal decomposition of gas and a plasma cleaning performed by decomposing a cleaning gas by a plasma.

When the plasma cleaning is performed, in the cathode coupling type, a high frequency voltage for plasma generation is applied to the lower electrode as in the dry etching process. In the lower side dual frequency application type, the second high frequency voltage for ion attraction is not applied and only the first high frequency for plasma generation is applied to the lower electrode. The cycle of the regular plasma cleaning is may be carried out lot by lot. However, it is preferable that the cycle is carried sheet by sheet to reliably prevent the influence of deposits on the process.

However, in the conventional capacitively coupled plasma etching apparatus, whenever the plasma cleaning is performed, a (dielectric) top surface portion of the electrostatic chuck is slightly eroded by an ion sputtering effect. Accordingly, as the plasma cleaning is repeatedly performed, such erosion is progressed, shortening the lifespan of the electrostatic chuck. Furthermore, when the dielectric portion of the electrostatic chuck is made of a metal, especially, e.g., alumina ceramic ($Al_2O_3$), the aluminum is scattered as particles or compounds (e.g., Al fluoride or Al chloride) in the chamber due to the erosion and some of the particles or the compounds is remain without being not exhausted. Such particles or compounds are attached to a substrate subjected to the etching process, thereby causing the metal contamination.

In addition, when the plasma cleaning is performed, only the high frequency voltage for the plasma generation is applied to the lower electrode. Nevertheless, a self bias voltage is unavoidably generated and an ion sheath is formed between the plasma and the lower electrode. Accordingly, ions in the plasma are accelerated by an electric field inside the ion sheath to be incident on the (dielectric) top surface portion of the electrostatic chuck, causing the dielectric material to sputter.

To prevent the metal contamination caused by the electrostatic chuck, a deposition creating process is performed by supplying a film formation gas, e.g., $SiCl_4$ gas, to the chamber after the plasma cleaning to coat the surface of the electrostatic chuck with a thin film made of $SiCl_xO_y$, or the like in the conventional capacitively coupled plasma etching apparatus. However, such a method requires expensive equipment such as gas structure for the depositing process and a prolonged post-processing, so that it is difficult to use the method.

SUMMARY OF THE INVENTION

In view of the above, the present invention provides a plasma etching apparatus and a plasma cleaning method capable of preventing erosion of an electrostatic chuck provided at an electrode to which a high frequency voltage is applied and on which a target object is mounted while ensuring a sufficient performance of a cleaning process performed in a processing chamber, to thereby increase a lifespan of the electrostatic chuck and suppress or prevent metal contamination.

In accordance with an aspect of the present invention, there is provided a plasma etching apparatus including an evacuable processing chamber; a first electrode for mounting a target object in the processing chamber; an electrostatic chuck provided on a mounting surface of the first electrode to hold the target object by an electrostatic force, a dielectric material of a surface layer portion of the electrostatic chuck including a metal; a second electrode disposed to face the first electrode in parallel in the processing chamber; an etching gas supply unit for supplying an etching gas to a processing space between the first and the second electrode to perform a dry etching process on the target object; a cleaning gas supply unit for supplying a cleaning gas to the processing space to perform a plasma cleaning in the processing chamber without the target object; a first high frequency power supply unit for supplying a first high frequency power to the first electrode, the first high frequency power contributing to plasma generation of the etching gas or the cleaning gas; and a controller for controlling the first high frequency power supply unit such that a first period during which the first high frequency power has a first amplitude that generates the plasma and a second period during which the first high frequency power has a second amplitude that generates substantially no plasma are alternately repeated at a specific cycle when the plasma cleaning is performed in the processing chamber without the target object.

In accordance with another aspect of the present invention, there is provided a plasma cleaning method for performing a plasma cleaning in an evacuable processing chamber without a target object in a plasma etching apparatus. The plasma etching apparatus includes the evacuable processing chamber; a first electrode for mounting a target object in the processing chamber; an electrostatic chuck provided on a mounting surface of the first electrode to hold the target object by an electrostatic force, a dielectric material of a surface layer portion of the electrostatic chuck including a metal; a second electrode disposed to face the first electrode in parallel in the processing chamber; an etching gas supply unit configured to supply an etching gas to a processing space between the first and the second electrode to perform a dry etching process on the target object; a cleaning gas supply unit for supplying a cleaning gas to the processing space to perform a plasma cleaning in the processing chamber without the target object; and a first high frequency power supply unit for supplying a first high frequency power to the first electrode, the first high frequency power contributing to plasma generation of the etching gas or the cleaning gas. A first period during which the first high frequency power has a first amplitude that generates the plasma and a second period during which the first high frequency power has a second amplitude that generates substantially no plasma are alternately repeated at a specific cycle.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Embodiments of the present invention will now be described with reference to the accompanying drawings which form a part hereof.

Figure 1:
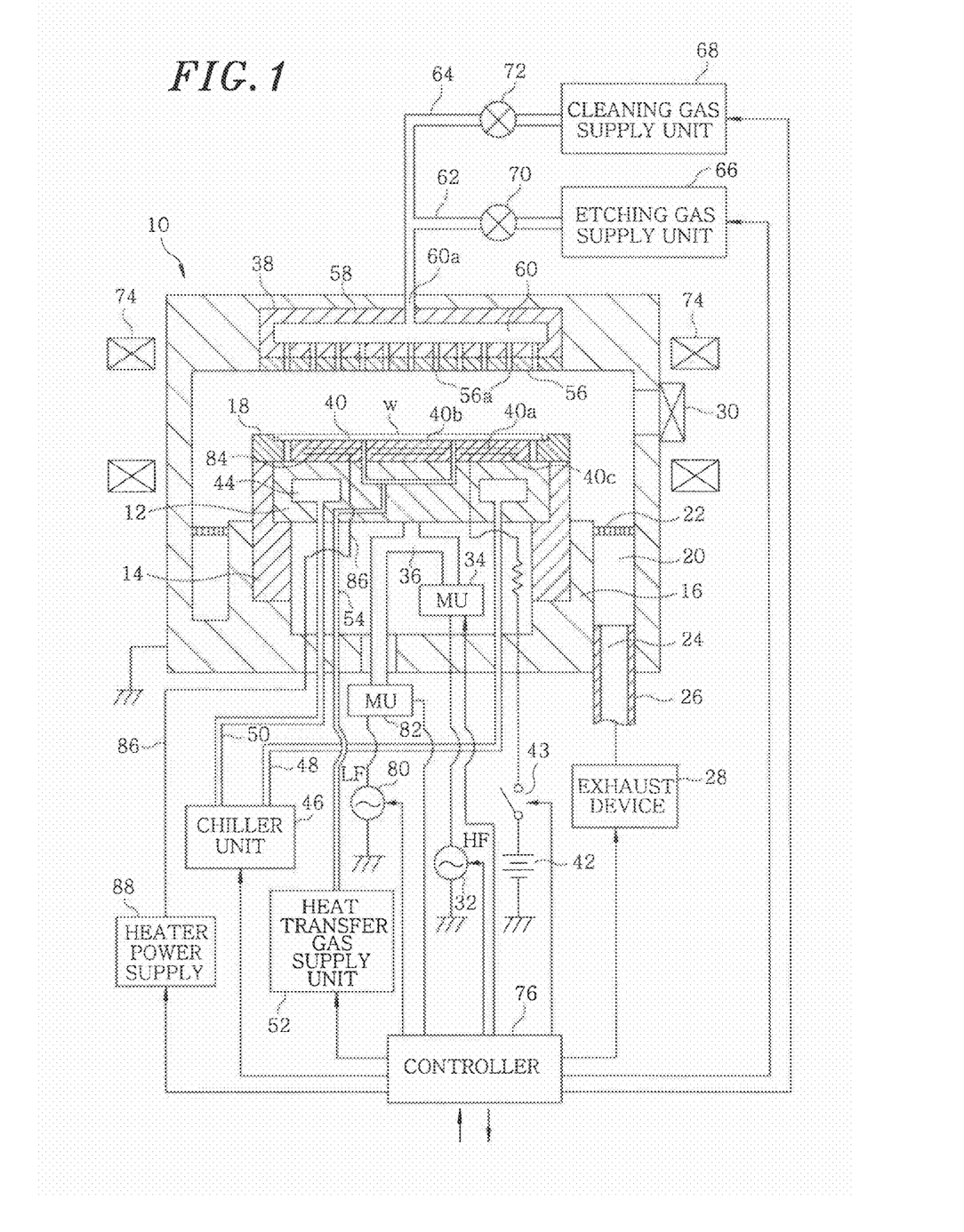
FIG. 1 shows a schematic configuration of a plasma etching apparatus in accordance with an embodiment of the present invention.

FIG. 1 shows a schematic configuration of a plasma etching apparatus in accordance with an embodiment of the present invention. The plasma etching apparatus is of a capacitively coupled type where dual high frequency powers are applied to a lower electrode, and includes a cylindrical chamber (processing chamber) 10 made of a metal, e.g., aluminum, stainless steel or the like. The chamber 10 is frame-grounded.

In the chamber 10, a cylindrical susceptor 12 serving as a lower electrode is provided to mount a target object (target substrate) thereon. The susceptor 12, which is made of, e.g., aluminum, is supported by an insulating tubular support 14, which is in turn supported by a cylindrical support portion 16 vertically upwardly extending from a bottom portion of the chamber 10. A focus ring 18 made of, e.g., quartz or silicon is arranged on an upper surface of the tubular support 14 to annularly surround a top surface of the susceptor 12.

An exhaust path 20 is formed between a sidewall of the chamber 10 and the cylindrical support portion 16. An annular baffle plate 22 is attached to the entrance or the inside of the exhaust path 20, and an exhaust port 24 is provided at a bottom portion of the chamber 10. An exhaust device 28 is connected to the exhaust port 24 via an exhaust pipe 26. The exhaust device 28 includes a vacuum pump to evacuate a processing space in the chamber 10 to a predetermined vacuum level. Attached to the sidewall of the chamber 10 is a gate valve 30 for opening and closing a gateway through which a semiconductor wafer W is loaded and unloaded.

A first high frequency power supply 32 for plasma generation is electrically connected to the susceptor 12 via a first matching unit (MU) 34 and a power feed rod 36. A first high frequency power HF is supplied from the first high frequency power supply 32 to the susceptor 12. The first high frequency power HF has a frequency (e.g., about 100 MHz) adequate to gas discharge. Moreover, provided at a ceiling portion of the chamber 10 is a shower head 38 serving as an upper electrode of ground potential. The first high frequency power HF from the first high frequency power supply 32 is capacitively applied between the susceptor 12 and the shower head 38.

Similarly, a second high frequency power supply 80 for ion attraction is electrically connected to the susceptor 12 via a second matching unit (MU) 82 and the power feed rod 36. A second high frequency power LF is supplied from the second high frequency power supply 80 to the susceptor 12. The second high frequency power LF has a frequency (e.g., about 13.56 MHz) adequate to attract ions or control an ion energy.

An electrostatic chuck 40 is provided on an upper surface of the susceptor 12 to hold the silicon wafer W by an electrostatic attraction force. The electrostatic chuck 40 includes a DC electrode 40a made of a conductive film and an upper and a lower dielectric layer 40b and 40c. The DC electrode 40a is interposed between the dielectric layers 40b and 40c. A DC power supply 42 is electrically connected to the electrode 40a via a switch 43. By applying a DC voltage from the DC power supply 42 to the DC electrode 40a, a semiconductor wafer W can be attracted to and held on the electrostatic chuck 40 by the Coulomb force.

Each of the dielectric layers 40b and 40c of the electrostatic chuck 40 is made of, e.g., alumina ceramic ($Al_2O_3$). In this embodiment, a heater 84 for controlling a wafer temperature is provided inside the lower dielectric layer 40c. The heater 84 includes a resistance heating wire having, e.g., a spiral shape and is electrically connected to a heater power supply 88 arranged outside the chamber 10 through an electrical cable 86. The dielectric layers 40b and 40c of the electrostatic chuck 40 made of alumina ceramic ($Al_2O_3$) having a high heat resistance, are endurable for the heat emitted from the heater 84.

A coolant path 44, which extends in, e.g., a circumferential direction, is provided inside the susceptor 12. A coolant, e.g., a cooling water, of a predetermined temperature is supplied from a chiller unit 46 to the coolant path 44 via pipelines 48 and 50 to be circulated. It is possible to control a process temperature of the semiconductor wafer W held on the electrostatic chuck 40 by adjusting the temperature of the coolant. Moreover, a heat transfer gas, e.g., He gas, is supplied from a heat transfer gas supply unit 52 to a space between a top surface of the electrostatic chuck 40 and a bottom surface of the semiconductor wafer W through a gas supply line 54.

The shower head 38 provided at the ceiling portion of the chamber 10 includes a lower electrode plate 56 having a plurality of gas injection holes 56a and an electrode holder 58 that detachably holds the electrode plate 56. Provided inside the electrode holder 58 is a buffer chamber 60 for radically diffusing a gas to make the pressure uniform.

A gas inlet opening 60a of the buffer chamber 60 is connected to an etching gas supply unit 66 and a cleaning gas supply unit 68 through gas supply lines 62 and 64, respectively. On-off valves 70 and 72 are provided in the gas supply lines 62 and 64, respectively. Mass flow controllers (not shown) are provided in the etching gas and cleaning gas supply unit 66 and 68, respectively.

Provided along a circumference of the chamber 10 is a magnet unit 74 extending annularly or concentrically around the chamber 10. When a plasma process is performed in the chamber 10, an RF electric field is vertically produced in the processing space between the shower head 38 and the susceptor 12. A high density plasma is generated near the surface of the susceptor 12 by gas discharge generated by applying the first high frequency power HF to the susceptor 12.

A controller 76 controls operations of various parts of the plasma etching apparatus, e.g., the exhaust device 28, the first high frequency power supply 32, the second high frequency power supply 80, the first matching unit 34, the second matching unit 82, the switch 43 for the electrostatic chuck 40, the chiller unit 46, the heat transfer gas supply unit 52, the etching gas supply unit 66, the cleaning gas supply unit 68, the on-off valves 70 and 72, and the like. The controller 76 is connected to a host computer (not shown) and the like.

In the plasma etching apparatus, in order to perform the dry etching, the gate valve 30 is opened first, and a target object, i.e., a semiconductor wafer W, is loaded in the chamber 10 and mounted on the electrostatic chuck 40. Then, the on-off valve 70 of the gas supply line 62 is opened and an etching gas (e.g., a gaseous mixture) is supplied from the etching gas supply unit 66 to the chamber 10 at a predetermined flow rate and flow rate ratio. Moreover, the pressure inside the chamber 10 is adjusted by the exhaust device 28 at a preset level.

Further, the first high frequency power HF having a preset level is supplied from the first high frequency power supply 32 to the susceptor 12 and the second high frequency power LH having a preset level is supplied from the second high frequency power supply 80 to the susceptor 12. Moreover, He gas as a heat transfer gas is supplied from heat transfer supply unit 52 to a gap between the surface of the electrostatic chuck 40 and the bottom surface of the semiconductor wafer W. Then, a DC voltage is applied to the DC power supply 42 to the DC electrode 40a of the electrostatic chuck 40 and the heat transfer gas is kept in a contact interface between the semiconductor wafer W and the electrostatic chuck 40 by an electrostatic attraction force.

In the meantime, the heater power supply 88 is turned on to supply a power (e.g., an AC power) to the heater 84 of the electrostatic chuck 40. The etching gas injected from the shower head 38 is converted to a plasma by a high frequency discharge generated between the shower head 38 serving as the upper electrode and the susceptor 12 serving as the lower electrode by the first high frequency power HF. A main surface of the semiconductor W is etched in a desired pattern by radicals and/or ions produced from the plasma.

In the capacitively coupled plasma etching apparatus, a high density plasma in a desirable dissociation state can be obtained by supplying to the susceptor 12 the first high frequency power HF having a relatively high frequency of about 100 MHz adequate for plasma generation. That is, a high-density plasma can be generated in a lower-pressure condition. At the same time, an anisotropic etching with high selectivity can be performed on the semiconductor wafer W mounted on the susceptor 12 by supplying to the susceptor 12 the second high frequency power LF having a relatively lower frequency of about 13.56 MHz adequate for ion attraction.

Further, in the capacitively coupled plasma etching apparatus, the temperature of the semiconductor wafer W is controlled by providing the susceptor 12 or the electrostatic chuck 40a with a cool heat from the chiller unit 46 and a heat from the heater 84 simultaneously. Accordingly, it is possible to perform temperature conversion or increase and decrease of the temperature at a high speed and also optionally or variously control the profile of temperature distribution.

In the dry etching process, polymers (e.g., fluorocarbon based polymers), produced by the radicals and/or ions in the plasma of the etching gas reacting with a material of an etching mask or a film to be etched, and/or particles, sputtered from the surface of the semiconductor wafer W, are not completely exhausted through the exhaust device 28 and some of the polymers or particles remain in the chamber 10, thereby being attached to members included in the chamber 10, e.g., the sidewall of the chamber 10, the electrode plate 56 of the shower head 38, the focus ring 18, the baffle plate 22 of the exhaust path 20 and the like, which face the processing space.

However, during the dry etching process, the semiconductor wafer W is mounted on the electrostatic chuck 40 and, thus, the electrostatic chuck 40 is not exposed to the plasma. Accordingly, no deposits are attached to the surface of the electrostatic chuck 40.

In this embodiment, to promptly remove deposits incidentally attached to the members included in the chamber 10 (excluding the electrostatic chuck 40) during the dry etching process, the cleaning process is regularly performed lot by lot preferably or sheet by sheet more preferably. Specifically, in the sheet-by-sheet cleaning process, immediately after the dry etching process is completed for one sheet, the processed semiconductor wafer W is unloaded from the chamber 10. Then, the plasma cleaning is performed in the chamber 10 in which no semiconductor wafer W is present.

In the lot-by-lot cleaning process, after the dry etching process is performed many times (e.g., 25 times) for one lot (e.g., 25 sheets) of semiconductor wafers W, the plasma cleaning is performed in the chamber 10 in which no semiconductor wafer W is present.

The controller 76 controls various parts of the plasma etching apparatus to perform the plasma cleaning process of the present embodiment. Specifically, the gate valve 30 is closed and, thus, the chamber 10 is sealed off. Then, the on-off valve 72 of the gas supply line 64 is opened and a cleaning gas (e.g., a gaseous mixture) is supplied from the cleaning gas supply unit 68 to the chamber 10 at a predetermined flow rate and flow rate ratio and the pressure inside the chamber 10 is adjusted by the exhaust device 28 at a preset level. Further, the first high frequency power HF that is pulse-modulated as will be described later is supplied from the first high frequency power supply 32 to the susceptor 12.

Here, a gaseous mixture in which a fluorine based gas, e.g., $SF_6$ gas, and $O_2$ gas are mixed can be adequately employed as the cleaning gas. The number of the F atoms generated in the plasma of the $SF_6$ gas is several times more than those of other fluorine based gases. Accordingly, it is possible to etch deposits (especially, Si compounds) at a high speed. Of course, another fluorine based gas, e.g., $NF_3$ gas may be adequately employed. The $O_2$ gas serves as an additive gas to suppress a polymerization reaction and accelerate the cleaning process. A ratio of the $O_2$ gas to the fluorine based gas (e.g., the $SF_6$ gas and the $NF_3$ gas) is preferably about 1:1.

In accordance with this embodiment, when the plasma cleaning is performed, the second high frequency power supply 80 for ion attraction is turned off. Moreover, since no semiconductor wafer W is provided on the electrostatic chuck 40, it is unnecessary to control the wafer temperature and the switch 43 for the DC voltage application and the heat transfer gas supply unit 52 are tuned off. However, it is necessary to control the temperatures of the electrostatic chuck 40 and the susceptor 12, so that the chiller unit 46 and the heater power supply 88 may be turned on.

In this embodiment, during the plasma cleaning, the controller 76 controls the first high frequency power supply 32 and the first matching unit 34 such that a plasma generation state and a plasma non-generation state can be alternately repeated by alternately repeating at a specific cycle a first period during which the first high frequency power HF has a first amplitude or a first crest value (i.e., an effective power) that generates the plasma and during which the first high frequency power HF has a second period having a second amplitude or a second crest value (i.e., no effective power) that generates substantially no plasma. Further, in this embodiment, the second amplitude is set as about 0 (i.e., no first high frequency power is supplied).

Figure 2:
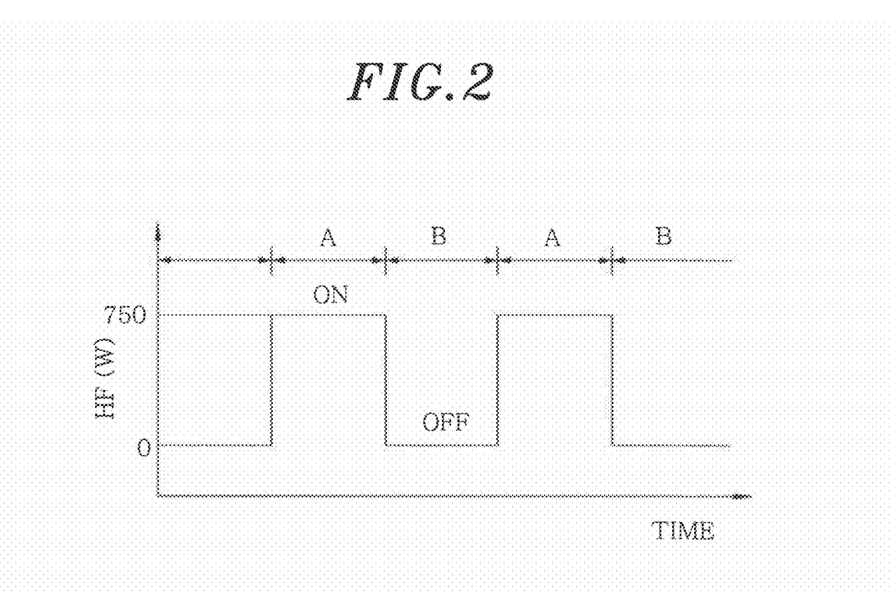
FIG. 2 shows characteristics of time/high frequency power magnitude of a pulse plasma.

In more detail, the first high frequency power HF supplied from the first high frequency power supply 32 to the susceptor 12 is modulated. FIG. 2 shows the modulation of pulse as a typical example of a modulated magnitude of a high frequency power.

As shown in FIG. 2, periods A are in the plasma generation state and periods B are in the plasma non-generation state. In the periods A during which a plasma is generated, the first high frequency power HF having the first amplitude of, e.g., about 750 W by power conversion is supplied to the susceptor 12. In the periods B during which no plasma is generated, the first high frequency power HF having the second amplitude of, e.g., about 0 W by power conversion is supplied to the susceptor 12. That is, a so-called pulse plasma is generated in the chamber 10 by alternately repeating on and off of the first high frequency power HF.

Figure 3:
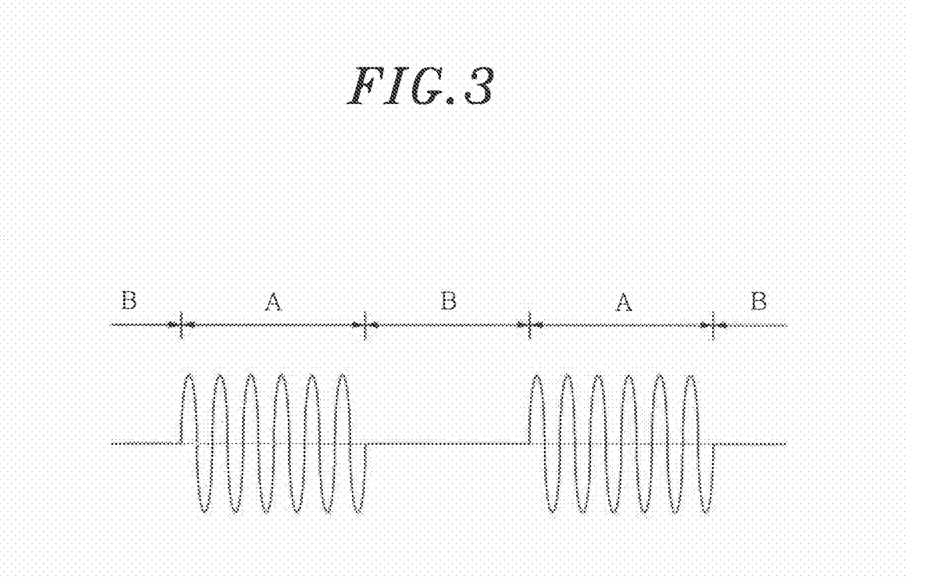
FIG. 3 shows a waveform of a first high frequency power of the pulse plasma shown in FIG. 2.

If a percentage (%) of on period to one cycle of on and off period is referred to as a duty, the duty is represented as 100A %/(A+B). For example, the duty of 50% may be selected by setting A=B. In this case, the waveform of the first high frequency power HF is shown in FIG. 3.

In addition, it is not necessary that the second amplitude of the plasma non-generation state be about 0 W. The first high frequency power HF can have as the second amplitude value any amplitude value that generates substantially no plasma. Similarly, even though the first amplitude of the plasma generation state is about 750 W by the power conversion, the present embodiment is not limited to 750 W. The first amplitude value can be set in a range of 400 W to 4000 W by the power conversion depending on the conditions of the cleaning process.

For the pulse modulation in accordance with this embodiment, a frequency at which the first amplitude (on period) and the second amplitude (off period) are alternately repeated is preferably sufficiently lower than that (e.g., about 27 MHz or more) of the first high frequency power HF. Typically, the modulation frequency is 1 kHz to 100 kHz and preferably 1 kHz to 60 kHz. If the modulation frequency is lower than 1 kHz, the ion-sputter suppressing effect of the present invention is significantly lowered.

Moreover, if the modulation frequency is higher than about 60 kHz, it becomes difficult to allow the pulse plasma to follow on and off of the first high frequency power HF, thereby significantly lowering the ion-sputter suppressing effect of the present invention.

The duty of the first amplitude (on period) is not limited to 50% and it is preferable to adequately set the duty in a range of 10% to 60%. If the duty is smaller than 10%, no plasma is generated, thereby failing to obtain an effective plasma cleaning. On the other hand, if the duty is higher than 60%, the ion-sputter suppressing effect of the present invention is significantly lowered.

Generally, in view of the cleaning effect, the duty and the cleaning time are in an inverse proportional relationship to each other. Accordingly, as the duty is greater, a needed time for the cleaning is shortened. As the duty is smaller, the needed time is lengthened.

For an experiment for the cleaning process of this embodiment, main conditions of the plasma cleaning are as follows.

Etching gas: $SF_6$ gas/$O_2$ gas=800 sccm/800 sccm
Chamber pressure: 200 mTorr
HF power: first amplitude/second amplitude=750 W/0 W
Modulation Frequency: 10 kHz
Duty: 50%
Temperature: upper electrode/sidewall of chamber/lower electrode=80/70/60° C.
Magnetic field: 320 G
Cleaning time: 40 seconds In the experiment, it can be seen that the cleaning rate of 100 Å/min to 250 Å/min was obtained at each position in the radical direction on a surface of the electrode plate 56 of the shower head 38. On a surface of the focus ring 18, the cleaning rate of 100 Å/min to 150 Å/min was obtained at each position in the radical direction. Moreover, on a sidewall of the chamber 10, the cleaning rate of 25 Å/min to 50 Å/min was obtained at each position in the vertical direction.

In the experiment, it can be seen that the cleaning rate of each part was about a half times as fast as that when the duty is 100% without change of other conditions (i.e., no pulse modulation).

Moreover, in the experiment, it can be seen that the cleaning rate is rarely changed when the magnitude of the first amplitude of the first high frequency power HF is increased to two times, i.e., 1500 W.

As a result, for the cleaning performance of the pulse-modulated plasma cleaning in accordance with the present embodiment, the cleaning rate is lowered substantially in proportion to the duty as compared with the plasma cleaning without the pulse modulation. However, when viewed from another aspect, the pulse-modulated plasma cleaning in accordance with the present embodiment can obtain the same cleaning result or the same cleaning performance as the plasma cleaning without the pulse modulation by setting the cleaning time slightly longer depending on the duty of pulse modulation (in the inverse proportional relationship).

In fact, the pulse-modulated plasma cleaning in accordance with the present embodiment has a main feature that it is possible to sufficiently suppress the erosion of a surface layer portion, i.e., the upper dielectric layer 40b of the electrostatic chuck 40.

In other words, in the plasma cleaning, if the first high frequency power HF for plasma generation is supplied to the susceptor 12, the cleaning gas is discharged to generate a plasma in the processing space between the susceptor (lower electrode) 12 and the shower head (upper electrode) 38. Further, a negative self-bias voltage is generated in the susceptor 12, so that an ion sheath is formed between the susceptor 12 and the plasma. Then, and positive ions in the plasma are accelerated by an electric field of the ion sheath to be incident on the upper dielectric layer 40b of the electrostatic chuck 40.

The alumina ceramic ($Al_2O_3$) as the material of the upper dielectric layer 40b has a sufficiently strong etching resistance against radicals of fluorine, oxygen and the like, but the aluminum or the ceramic ($Al_2O_3$) has a relatively weaker etching resistance to physical etching (ion sputtering) caused by the ion incidence. As a result, the upper dielectric layer 40b made of the alumina ceramic ($Al_2O_3$) is inevitably eroded.

Here, if the first high frequency power HF is pulse-modulated, in the second period B during which the first high frequency power HF has the second amplitude in each cycle of modulation frequency, at least no self-bias voltage exist and the ion sputtering is stopped in the upper dielectric layer 40b of the electrostatic chuck 40. Accordingly, the ion sputtering can be suppressed.

Such action of suppressing the ion sputtering by the pulse modulation has the same effect as in the case of applying the above pulse modulation in the dry etching process for the semiconductor wafer W. This can be proved in a trimming process of resist pattern, for example.

Figure 4A:
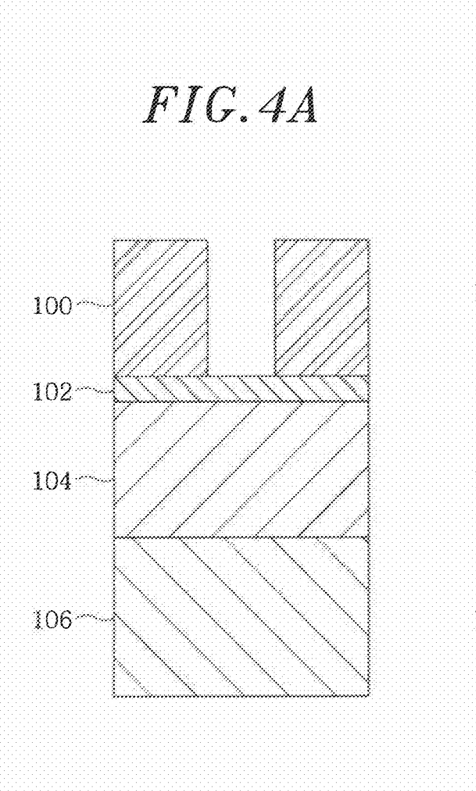
FIGS. 4A to 4C are cross sectional views showing a process order of a trimming process.
Figure 4B:
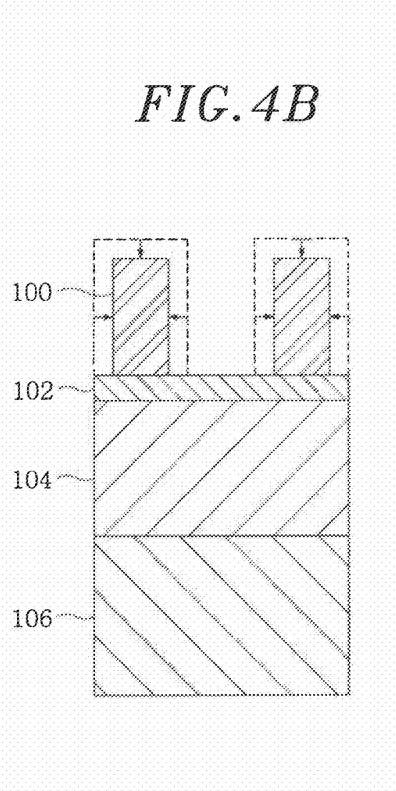
Figure 4C:
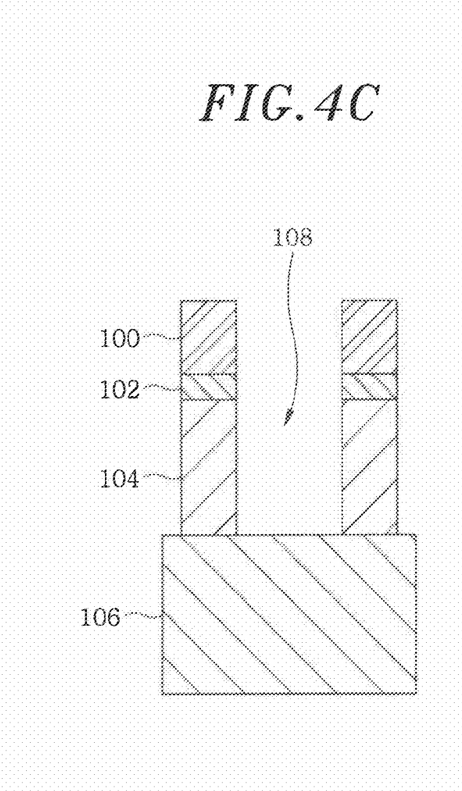

As shown in FIG. 4A, a sidewall of the resist pattern 100 is formed by the photolithography. Typically, a trimming process forms the sidewall of the resist pattern 100 into a finer pattern as shown in FIG. 4B. If a target etching film 104 is etched by using the thinly formed resist pattern 100 as a mask, a hole or recess 108 having a desired size can be obtained as shown in FIG. 4C. In FIGS. 4A to 4C, a reference number 102 is an antireflection coating and a reference number 106 is a base film or a base substrate.

In the resist process, the attempt to form a resist pattern having a desired thin size without the trimming process may cause resist collapse during the photolithography process (especially, development). To that end, after the photolithography process, the trimming process is performed to make the resist pattern to have a desired thin size.

However, in the trimming process, the sidewall of the resist pattern 100 is horizontally etched and an upper surface of the resist pattern 100 is vertically etched. Here, a radical based etching mainly dominantly contributes to the horizontal etching (trimming) of the resist pattern 100 and an ion based etching mainly dominantly contributes to the vertical etching (resist loss).

Accordingly, to proof the effect of the present invention, it is meaningful to compare a typical non-modulation (continuous wave (CW)) method with a pulse-modulation method in the trimming process in view of the radical based etching and the ion based etching.

From the above point of view, the comparison of the typical non-modulation (CW) method with the pulse-modulation method was performed through an experiment of the trimming process by using the capacitively coupled plasma etching apparatus (shown in FIG. 1). In the experiment of the trimming process, main conditions are as follows.

Diameter of semiconductor wafer: 300 mm
Etching gas: $O_2$ gas/$N_2$ gas=50 sccm/50 sccm
Chamber pressure: 50 mTorr
HF power: first amplitude/second amplitude=70 W, 80 W/0 W
Modulation Frequency: 10 kHz and 100 kHz
Duty: 50%
Temperature: upper electrode/sidewall of chamber/lower electrode=80/70/60° C.

Magnetic field: 320 G

Cleaning time: 20 to 26 seconds

Figure 5:
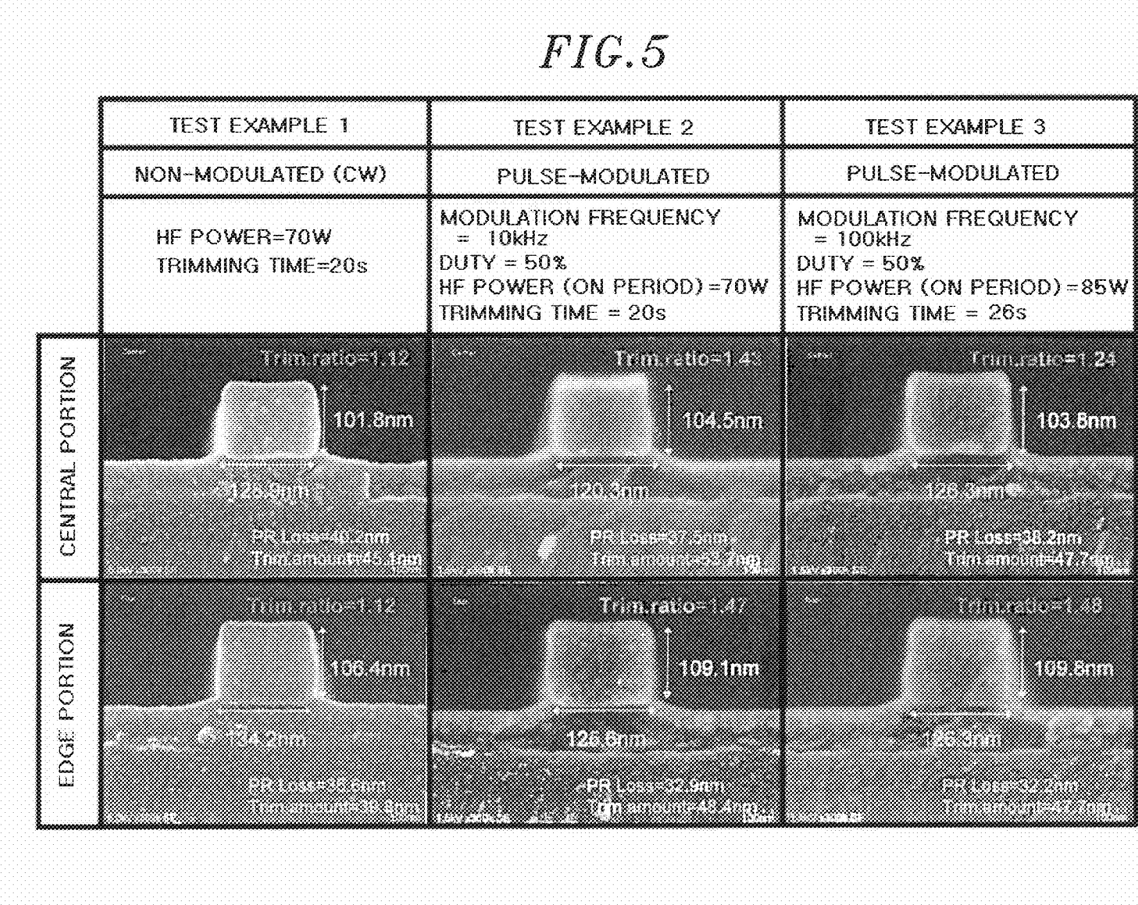
FIG. 5 is a table in which trimming characteristics obtained through test examples of a trimming process for the effects of the embodiment of the present invention.

FIG. 5 is a table where trimming characteristics obtained in test examples 1 to 3 and SEM pictures are illustrated.

Test Example 1

The non-modulation (CW) trimming process was carried out for 20 seconds by using a first high frequency power HF of 70 W. At a central portion of a semiconductor wafer, a vertical etching rate, i.e., a resist loss rate (PR loss) was 40.2 nm and a horizontal etching rate, i.e., a trimming amount (Trim. amount) was 45.1 nm. A trimming ratio (Trim. Ratio) was 45.1 nm/40.2 nm, i.e., 1.12. At an edge portion of the semiconductor, the resist loss rate (PR loss) was 35.6 nm and the trimming amount (Trim. amount) was 39.8 nm. The trimming ratio (Trim. ratio) was 1.12.

Test Example 2

The same pulse-modulation trimming process as the plasma cleaning of the present embodiment was carried out for 26 seconds by using the first high frequency power HF having the magnitude (magnitude of on period or first amplitude) of 70 W. At the central portion, the resist loss rate (PR loss) was 37.5 nm and the trimming amount (Trim. amount) was 53.7 nm. The trimming ratio (Trim. ratio) was 1.43. At the edge portion, the resist loss rate (PR loss) was 32.9 nm and the trimming amount (Trim. amount) was 48.4 nm. The trimming ratio (Trim. ratio) was 1.47.

Test Example 3

The same pulse-modulation trimming process as the plasma cleaning of the present embodiment was carried out for 26 seconds by using the first high frequency power HF having the magnitude (magnitude of on period or first amplitude) of 85 W. At the central portion, the resist loss rate (PR loss) was 38.2 nm and the trimming amount (Trim. amount) was 47.7 nm. The trimming ratio (Trim. ratio) was 1.24. At the edge portion, the resist loss rate (PR loss) was 32.2 nm and the trimming amount (Trim. amount) was 47.7 nm. The trimming ratio (Trim. ratio) was 1.48.

As described above, if the non-modulation (CW) test example 1 is compared with the pulse-modulation test examples 2 and 3, it can be seen that the radical based etching rate (trimming amount) of the non-modulation (CW) method is not significantly different from that of the pulse-modulation method. However, the ion based etching rate (resist loss rate) of the pulse-modulation method is much lower than that of the non-modulation (CW) method.

In other words, by turning on and off the first high frequency power HF contributing to the plasma generation at the adequate modulation frequency and duty, the pulse-modulation method yields little effect on the radical based etching but suppress an etching rate of the ion based etching. The pulse-modulation method is not limited to the trimming process and is adequate for a plasma etching in which the radical etching and the ion based etching are carried out together.

Furthermore, such a principle is important to the plasma cleaning process of the present embodiment. Specifically, as described above, the alumina ceramic ($Al_2O_3$) as the material of the upper dielectric layer 40b has a sufficiently strong etching resistance against radicals of fluorine, oxygen and the like, but has a relatively weaker etching resistance to physical etching (ion sputtering) caused by the ion incidence.

Accordingly, if the ion sputtering becomes weak under the given conditions, the erosion of the upper dielectric layer 40b of the electrostatic chuck 40 is inevitably reduced. As a result, it is possible to lengthen a lifespan of the electrostatic chuck 40 and suppress or prevent metal contamination. That is, it is evitable that the upper dielectric layer 40b of the electrostatic chuck 40 is eroded by the plasma cleaning process. However, by reducing the erosion level or by making erosion rate as slow as possible, the amount of the aluminum attached to each semiconductor wafer W as the target object can be controlled within an allowable range, thereby preventing the metal contamination.

As such, in accordance with the plasma cleaning method of the present embodiment, it is possible to generate a pulse plasma for cleaning in the chamber 10 in which no semiconductor wafer W is provided by pulse-modulating a high frequency power HF for plasma generation supplied to the susceptor 12 at a predetermined modulation frequency or duty, thereby maintaining the cleaning performance, and effectively efficiently suppress the erosion of a surface layer portion of the electrostatic chuck 40. Accordingly, it is possible to maintain the inside of the chamber 10 as a non-deposit state and increase the lifespan of the electrostatic chuck 40. As a result, the metal contamination can be suppressed or prevented.

Figure 6A:
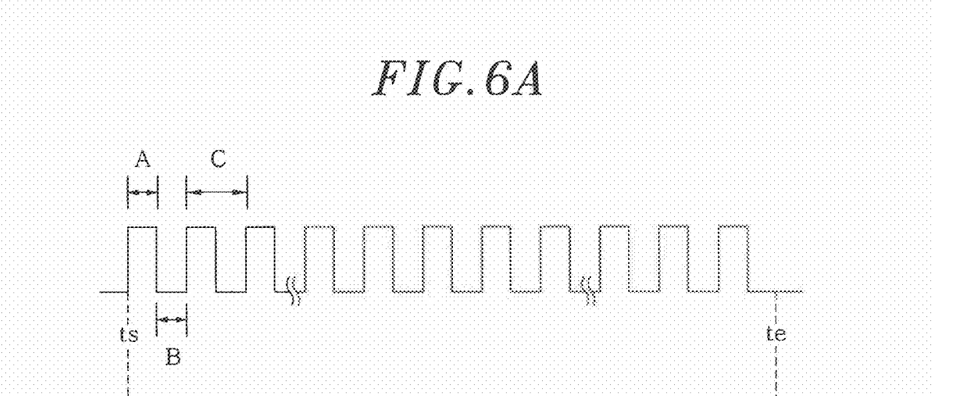
FIGS. 6A and 6B show waveforms of a sequence of plasma cleaning depending on sequence types in accordance with the embodiment of the present invention.
Figure 6B:
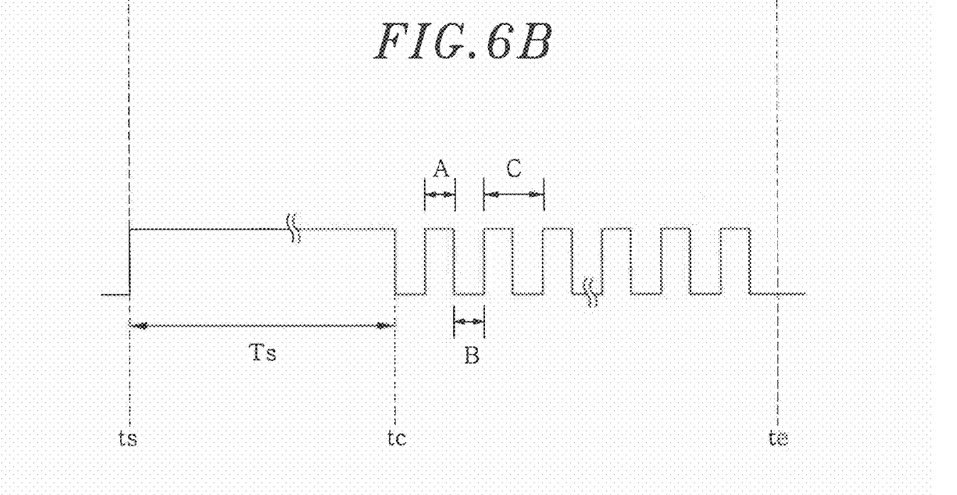

Moreover, in the present embodiment, a first type shown in FIG. 6A or a second type shown in FIG. 6B can be employed as a sequence of the plasma cleaning. In accordance to the first type, for the first high frequency power HF, the first period A and the second period B are alternately repeated at a desired cycle C between a start point of time $t_s$ and an end point of time $t_e$ of the cleaning. In accordance with the second type, the first amplitude of the first high frequency power HF is maintained during a period of time $T_s$ between a start point of time $t_s$ when the first high frequency power HF is started to be supplied to the susceptor 12 and a point of time $t_c$; and the first period A and the second period B are alternately repeated in the first high frequency power HF at the cycle C after the point of time $t_c$.

In the second type, the period of time $T_s$ or the point of time $t_c$ may be determined depending on various conditions. For example, when the increase in the plasma generation is not sufficient because the duty of pulse modulation is relatively small, a point of time when the plasma is initially ignited after the cleaning is started may be monitored by a plasma monitor to be set the monitored point of time as the point of time $t_c$; or the period of time $T_s$ may be determined as an empirically obtained period of time required until the plasma becomes stable.

In addition, to arbitrarily control a balance between the cleaning efficiency and the erosion suppressing effect, the cleaning time may be divided into a first cleaning time for performing a rough cleaning and a second cleaning time for performing a finishing cleaning to determine the period of time $T_s$ (between $t_s$ and $t_c$) as the first cleaning time and a remaining period of time (between $t_c$ and $t_e$) as the second cleaning time.

In accordance with the plasma etching apparatus and the plasma cleaning method of the present embodiment, it is possible to obtain a sufficient performance of the cleaning process in the processing chamber and prevent erosion of the electrostatic chuck provided at the electrode to which a high frequency voltage is applied and on which a target object is mounted. Accordingly, a lifespan of the electrostatic chuck is increased, and the metal contamination is suppressed or prevented.

While the invention has been shown and described with respect to the embodiments, it will be understood by those skilled in the art that various changes and modification may be made without departing from the scope of the invention as defined in the following claims.

For example, the present embodiment is adequately applicable to a capacitively coupled plasma etching apparatus of lower side single frequency application type in which a high frequency power for plasma generation and ion attraction is supplied to a susceptor (lower electrode). Moreover, the material of the surface layer portion of the electrostatic chuck is not limited to alumina ceramic ($Al_2O_3$). Alternatively, the surface layer portion of the electrostatic chuck may be made of a dielectric material including a metal.

In the present invention, the target substrate is not limited to the semiconductor wafer. Alternatively, the present invention can be applied to various substrates for plat panel display, photomasks, CD substrates, print substrates, and the like.

What is claimed is:

1. A plasma cleaning method for performing a plasma cleaning in an evacuable processing chamber without a target object in a plasma etching apparatus comprising:
   the evacuable processing chamber;
   a first electrode for mounting the target object in the processing chamber;
   an electrostatic chuck provided on a mounting surface of the first electrode to hold the target object by an electrostatic force, a dielectric material of a surface layer portion of the electrostatic chuck including a metal;
   a second electrode disposed to face the first electrode in parallel in the processing chamber;
   an etching gas supply unit configured to supply an etching gas to a processing space between the first and the second electrode to perform a dry etching process on the target object;
   a cleaning gas supply unit for supplying a cleaning gas to the processing space to perform the plasma cleaning in the processing chamber without the target object;
   a first high frequency power supply unit for supplying a first high frequency power to the first electrode, the first high frequency power contributing to plasma generation of the etching gas or the cleaning gas; and
   a second high frequency power supply unit for supplying to the first electrode a second high frequency power for ion attraction,
   wherein the plasma cleaning method comprises, during a first period, applying power with the first high frequency power at a first power level that generates the plasma, and during a second period, applying power with the first high frequency power at a second power level that generates substantially no plasma, and wherein the first period and the second period are alternately repeated at a specific cycle so as to suppress an ion sputtering caused by a self-bias voltage generated in the first electrode,
   wherein the plasma cleaning method further comprises controlling the first high frequency power supply unit such that the first high frequency power continuously applies power at the first power level between a start point of time when the first high frequency power is started to be supplied to the first electrode and a point of time $t_c$ which is a point of time when a period of time $T_s$ has elapsed since the start point of time; and after the point of time $t_c$, the first period and the second period are alternately repeated at the specific cycle, and wherein the first period is shorter than the period of time $T_s$,
   wherein the point of time $t_c$ is a point of time when a discharge of the cleaning gas becomes stable, and
   wherein the plasma cleaning method further comprises maintaining the second high frequency power supply unit turned off.

2. The method of claim 1, wherein a plasma cleaning time set for the plasma cleaning is divided into a first cleaning time and a second cleaning time by the point of time $t_c$; and the first high frequency power supply unit is controlled such that the first high frequency power continuously has the first power level during the first cleaning time and the first period and the second period are alternately repeated at the specific cycle during the second cleaning time.

3. The method of claim 2, wherein the dielectric material of the surface layer portion of the electrostatic chuck includes $Al_2O_3$.

4. The method of claim 2, wherein the second power level is zero.

5. The method of claim 2, wherein a frequency at which the first and the second period are alternately repeated is about 1 kHz to 60 kHz.

6. The method of claim 2, wherein a duty of the first period is about 10% to 60%.

7. The method of claim 2, wherein the cleaning gas is a gaseous mixture in which $SF_6$ gas or $NF_3$ gas and $O_2$ gas are mixed.

8. The method of claim 1, wherein the dielectric material of the surface layer portion of the electrostatic chuck includes $Al_2O_3$.

9. The method of claim 1, wherein the second power level is zero.

10. The method of claim 1, wherein a frequency at which the first and the second period are alternately repeated is about 1 kHz to 60 kHz.

11. The method of claim 1, wherein a duty of the first period is about 10% to 60%.

12. The method of claim 1, wherein the cleaning gas is a gaseous mixture in which $SF_6$ gas or $NF_3$ gas and $O_2$ gas are mixed.

13. The method of claim 1, wherein the plasma etching apparatus further comprises a first temperature control unit supplying a coolant of a predetermined temperature to a coolant path provided inside the first electrode and a second temperature control unit supplying an electric power for resistance heating to a heater provided inside the electrostatic chuck, and
   wherein the plasma cleaning is performed while the first electrode and the electrostatic chuck are respectively maintained at predetermined temperatures by the first and the second temperature control unit.

14. A plasma cleaning method for performing a plasma cleaning in an evacuable processing chamber without a target object in a plasma etching apparatus comprising:
   the evacuable processing chamber;
   a first electrode for mounting the target object in the processing chamber;
   an electrostatic chuck provided on a mounting surface of the first electrode to hold the target object by an electrostatic force, a dielectric material of a surface layer portion of the electrostatic chuck including a metal;

a second electrode disposed to face the first electrode in parallel in the processing chamber;

an etching gas supply unit configured to supply an etching gas to a processing space between the first and the second electrode to perform a dry etching process on the target object;

a cleaning gas supply unit for supplying a cleaning gas to the processing space to perform the plasma cleaning in the processing chamber without the target object;

a first high frequency power supply unit for supplying a first high frequency power to the first electrode, the first high frequency power contributing to plasma generation of the etching gas or the cleaning gas; and a second high frequency power supply unit for supplying to the first electrode a second high frequency power for ion attraction, wherein the plasma cleaning method comprises, during a first period, applying power with the first high frequency power at a first power level that generates the plasma, and during a second period, applying power with the first high frequency power at a second power level that generates substantially no plasma, and wherein the first period and the second period are alternately repeated at a specific cycle so as to suppress an ion sputtering caused by a self-bias voltage generated in the first electrode, wherein the plasma cleaning method further comprises controlling the first high frequency power supply unit such that the first high frequency power continuously applies power at the first power level between a start point of time when the first high frequency power is started to be supplied to the first electrode and a point of time $t_c$ which is a point of time when a period of time $T_s$ has elapsed since the start point of time; and after the point of time $t_c$, the first period and the second period are alternately repeated at the specific cycle, and wherein the first period is shorter than the period of time $T_s$, wherein the point of time $t_c$ is a point of time when the plasma is ignited, and wherein the plasma cleaning method further comprises maintain the second high frequency power supply unit turned off.

15. The method of claim 14, wherein the dielectric material of the surface layer portion of the electrostatic chuck includes $Al_2O_3$.

16. The method of claim 14, wherein the second power level is zero.

17. The method of claim 14, wherein a frequency at which the first and the second period are alternately repeated is about 1 kHz to 60 kHz.

18. The method of claim 14, wherein a duty of the first period is about 10% to 60%.

19. The method of claim 14, wherein the cleaning gas is a gaseous mixture in which $SF_6$ gas or $NF_3$ gas and $O_2$ gas are mixed.

* * * * *